(12) United States Patent
Shibata et al.

(10) Patent No.: US 11,647,269 B2
(45) Date of Patent: May 9, 2023

(54) IMAGING ELEMENT-MOUNTING BOARD

(71) Applicant: NITTO DENKO CORPORATION, Osaka (JP)

(72) Inventors: Shusaku Shibata, Osaka (JP); Hayato Takakura, Osaka (JP); Yoshihiro Kawamura, Osaka (JP); Masaki Ito, Osaka (JP); Shuichi Wakaki, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 147 days.

(21) Appl. No.: 16/756,253

(22) PCT Filed: Oct. 2, 2018

(86) PCT No.: PCT/JP2018/036759
§ 371 (c)(1),
(2) Date: Apr. 15, 2020

(87) PCT Pub. No.: WO2019/082608
PCT Pub. Date: May 2, 2019

(65) Prior Publication Data
US 2021/0195070 A1    Jun. 24, 2021

(30) Foreign Application Priority Data

Oct. 26, 2017   (JP) ............................. JP2017-207237

(51) Int. Cl.
*H04N 5/225* (2006.01)
*H01L 27/146* (2006.01)
*H04N 5/369* (2011.01)

(52) U.S. Cl.
CPC ..... *H04N 5/2253* (2013.01); *H01L 27/14636* (2013.01); *H04N 5/369* (2013.01)

(58) Field of Classification Search
CPC .......................... H04N 5/2253; H05K 1/0281
See application file for complete search history.

(56) References Cited

U.S. PATENT DOCUMENTS

| | | | |
|---|---|---|---|
| 2007/0001308 A1 | 1/2007 | Takemura et al. | |
| 2009/0225431 A1* | 9/2009 | Lee ..................... | H04N 5/2257 359/811 |
| 2010/0078786 A1 | 4/2010 | Maeda | |

(Continued)

FOREIGN PATENT DOCUMENTS

| | | |
|---|---|---|
| CN | 101827494 A | 9/2010 |
| CN | 103098561 A | 5/2013 |

(Continued)

OTHER PUBLICATIONS

Office Action, issued by the Japanese Patent Office dated Oct. 19, 2021, in connection with Japanese Patent Application No. 2017-207237.

(Continued)

*Primary Examiner* — Tony Ko
(74) *Attorney, Agent, or Firm* — Edwards Neils LLC; Jean C. Edwards, Esq.

(57) ABSTRACT

An imaging element-mounting board includes a board area having a board disposed and a plurality of reinforcement portions disposed around the board area. The plurality of reinforcement portions are independent from each other.

10 Claims, 11 Drawing Sheets

(56) References Cited

U.S. PATENT DOCUMENTS

| | | |
|---|---|---|
| 2010/0208442 A1 | 8/2010 | Asano et al. |
| 2010/0224397 A1 | 9/2010 | Shimizu et al. |
| 2010/0252307 A1* | 10/2010 | Mo .................. H05K 1/0281 174/254 |
| 2013/0183499 A1 | 7/2013 | Kido et al. |
| 2016/0095209 A1 | 3/2016 | Starkston et al. |
| 2019/0080977 A1 | 3/2019 | Maekawa et al. |

FOREIGN PATENT DOCUMENTS

| | | | | |
|---|---|---|---|---|
| JP | 2000-068328 A | | 3/2000 | |
| JP | 2000-183438 | * | 6/2000 | ............... H01S 5/00 |
| JP | 2003-332496 A | | 11/2003 | |
| JP | 2005-210628 A | | 8/2005 | |
| JP | 2007-294724 A | | 11/2007 | |
| JP | 2008-306350 A | | 12/2008 | |
| JP | 2009-081357 A | | 4/2009 | |
| JP | 2010-080808 A | | 4/2010 | |
| JP | 2010-103516 A | | 5/2010 | |
| JP | 2010-192546 A | | 9/2010 | |
| JP | 2013-118364 A | | 6/2013 | |
| JP | 2015-119091 A | | 6/2015 | |
| JP | 2016-139633 A | | 8/2016 | |
| WO | 2017/135395 A1 | | 8/2017 | |

OTHER PUBLICATIONS

International Search Report Issued in PCT/JP2018/036759 dated Dec. 25, 2018.
Written Opinion Issued in PCT/JP2018/036759 dated Dec. 25, 2018.
Office Action, issued by the Japanese Patent Office dated Jan. 11, 2022, in connection with Japanese Patent Application No. 2017-207237.
Office Action, issued by the Taiwanese Patent Office dated Jul. 11, 2022, in connection with Taiwanese Patent Application No. 107135371.
First Office Action, issued by China National Intellectual Property Administration dated Jan. 18, 2023, in connection with Chinese Patent Application No. 201880065622.9.

* cited by examiner

FIG. 3
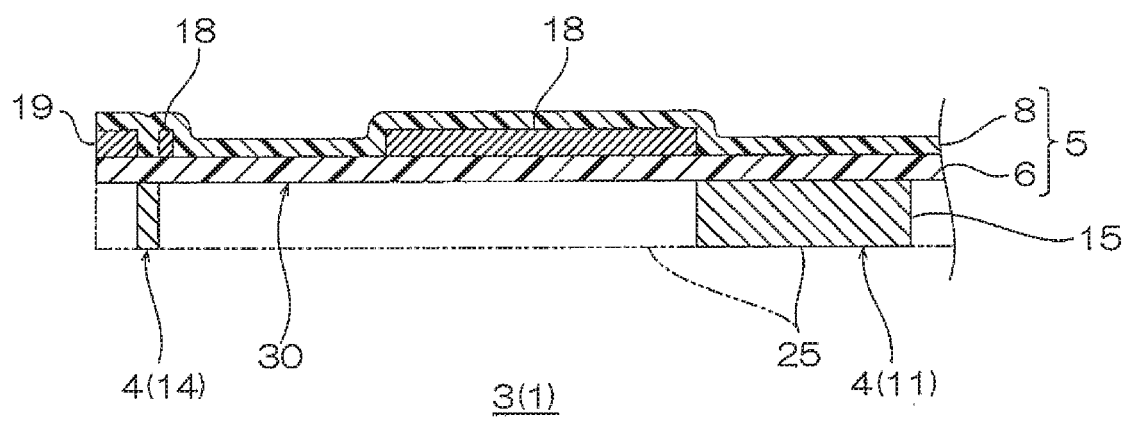
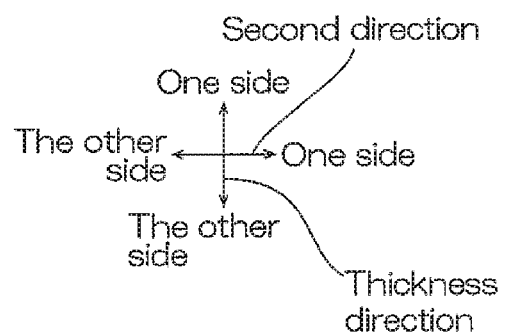

IMAGING ELEMENT-MOUNTING BOARD

CROSS-REFERENCE TO RELATED APPLICATIONS

The present application is a 35 U.S.C. 371 National Stage Entry of PCT/JP2018/036759, filed on Oct. 2, 2018, which claims priority from Japanese Patent Application No. 2017-207237, filed on Oct. 26, 2017, the contents of all of which are herein incorporated by reference in their entirety.

TECHNICAL FIELD

The present invention relates to an imaging element-mounting board.

BACKGROUND ART

Conventionally, a semiconductor-mounting board for an imaging device for mounting a semiconductor for imaging has been known.

CITATION LIST

Patent Document

Patent Document 1: Japanese Unexamined Patent Publication No. 2005-210628

SUMMARY OF THE INVENTION

Problem to be Solved by the Invention

Recently, the semiconductor-mounting board for an imaging device is required to have a reduction in thickness (reduction in height). However, there is a disadvantage that when the semiconductor-mounting board for an imaging device achieving a reduction in thickness is a resin board, creases, wrinkles, or the like can be easily generated at the time of handling thereof in particular.

Then, it is considered that a frame-shaped metal reinforcement portion is provided around an area on which the semiconductor for imaging is mounted.

To form the metal reinforcement portion, first, the resin board is laminated on a solid metal layer, and thereafter, the central portion of the metal layer is removed by trimming.

When the metal layer is a solid shape (before trimming), deformation is prevented by a supporting force of the metal layer, while in the resin board, a contractive force is generated caused by a difference of a contraction rate between the resin board and the metal layer. However, when the central portion is removed by the above-described trimming, the supporting force of the metal layer is reduced, and thus, the resin board sags (is deformed) by the contractive force. Then, there is a disadvantage that the subsequent handleability is reduced, and furthermore, the semiconductor cannot be accurately mounted.

The present invention provides an imaging element-mounting board that is capable of suppressing generation of creases and wrinkles, suppressing deformation, and accurately mounting an imaging element with excellent handleability.

Means for Solving the Problem

The present invention (1) includes an imaging element-mounting board including a board area having a board disposed and a plurality of reinforcement portions disposed around the board area, wherein the plurality of reinforcement portions are independent from each other.

In the imaging element-mounting board, the board area is reinforced by the plurality of reinforcement portions, so that generation of the creases and the wrinkles is reduced. The plurality of reinforcement portions are independent from each other, so that there is no reinforcement portion between the plurality of reinforcement portions, and thus, the contractive force generated in the board area can be released (dispersed). Therefore, the deformation caused by the contractive force can be suppressed. As a result, the imaging element-mounting board has excellent handleability and can accurately mount the imaging element thereon, while reducing the generation of the creases and the wrinkles.

The present invention (2) includes the imaging element-mounting board described in (1), wherein the plurality of reinforcement portions include the reinforcement portions facing each other with the board area sandwiched therebetween in a plane direction perpendicular to a thickness direction.

In the imaging element-mounting board, the plurality of reinforcement portions include the reinforcement portions facing each other with the board area sandwiched therebetween in the plane direction, so that the deformation caused by the contractive force can be suppressed, while the generation of the creases and the wrinkles at the time of handling thereof is suppressed.

The present invention (3) includes the imaging element-mounting board described in (1) or (2), wherein the board area is a plural board area in which the plurality of boards are disposed in alignment.

In the imaging element-mounting board, the board area is a plural board area in which the plurality of boards are disposed in alignment in the plane direction perpendicular to the thickness direction, so that the plurality of boards can be collectively reinforced.

The present invention (4) includes the imaging element-mounting board described in (3), wherein the plural board area has a generally rectangular shape, and the plurality of reinforcement portions are disposed corresponding to each of the sides of the plural board area.

In the imaging element-mounting board, the plurality of reinforcement portions are disposed corresponding to each of the sides of the plural board area, so that the plurality of boards can be efficiently reinforced.

The present invention (5) includes the imaging element-mounting board described in (3) or (4) further including an auxiliary reinforcement portion disposed at the inside of the plural board area.

In the imaging element-mounting board, the plurality of boards can be collectively reinforced by the reinforcement portion, while the board at the inside of the plural board area is reinforced by the auxiliary reinforcement portion.

The present invention (6) includes the imaging element-mounting board described in (1) or (2), wherein the board area is a singular board area in which the single number of board is disposed.

In the imaging element-mounting board, the board area is the singular board area in which the single number of board is disposed in alignment, so that each board can be surely reinforced.

The present invention (7) includes the imaging element-mounting board described in (6), wherein the singular board area has a generally rectangular shape, and the plurality of reinforcement portions are disposed corresponding to each of the sides of the singular board area.

In the imaging element-mounting board, the plurality of reinforcement portions are disposed corresponding to each of the sides of the singular board area, so that each board can be efficiently reinforced.

The present invention (8) includes the imaging element-mounting board described in at least any one of (4), (5), and (7), wherein each of the plurality of reinforcement portions has a generally linear shape, the plurality of reinforcement portions are disposed so that a phantom line passing each of the plurality of reinforcement portions has an intersection point, and the reinforcement portion is not formed in a portion corresponding to the intersection point.

In the imaging element-mounting board, the reinforcement portion is not formed in the portion corresponding to the intersection point, so that the contractive force generated in the board area can be released in at least two directions along at least the two reinforcement portions corresponding to the intersection point and having a generally linear shape.

The present invention (9) includes the imaging element-mounting board described in any one of (1) to (8), wherein a material for the plurality of reinforcement portions is a metal, and the board area includes a resin film.

In the imaging element-mounting board, the material for the plurality of reinforcement portions is the metal, and the board area includes the resin film, so that a difference of a contraction rate between the metal and the resin is large, and thus, the above-described contractive force is easily generated.

As described above, however, the plurality of reinforcement portions are independent from each other, so that the contractive force can be released. As a result, the deformation caused by the contractive force can be suppressed. Accordingly, the imaging element-mounting board has excellent handleability, and the imaging element can be accurately mounted thereon.

The present invention (10) includes the imaging element-mounting board described in any one of (1) to (7), wherein the board area has a thickness of 50 µm or less.

In the imaging element-mounting board, the thickness of the board area is thin of 50 µm or less, so that a reduction in thickness thereof can be achieved.

Meanwhile, in the thin board area, the contractive force is easily generated. In the imaging element-mounting board, however, as described above, the contractive force can be easily released. Thus, the deformation caused by the contractive force can be suppressed. As a result, the imaging element-mounting board has excellent handleability, and the imaging element can be accurately mounted thereon.

Effect of the Invention

The imaging element-mounting board of the present invention can accurately mount the imaging element thereon, while reducing the generation of the creases and the wrinkles, and having excellent handleability.

BRIEF DESCRIPTION OF THE DRAWINGS

FIG. 3 shows a cross-sectional view along an A-A line of the imaging element-mounting board shown in FIG. 2.

DESCRIPTION OF EMBODIMENTS

Figure 1:
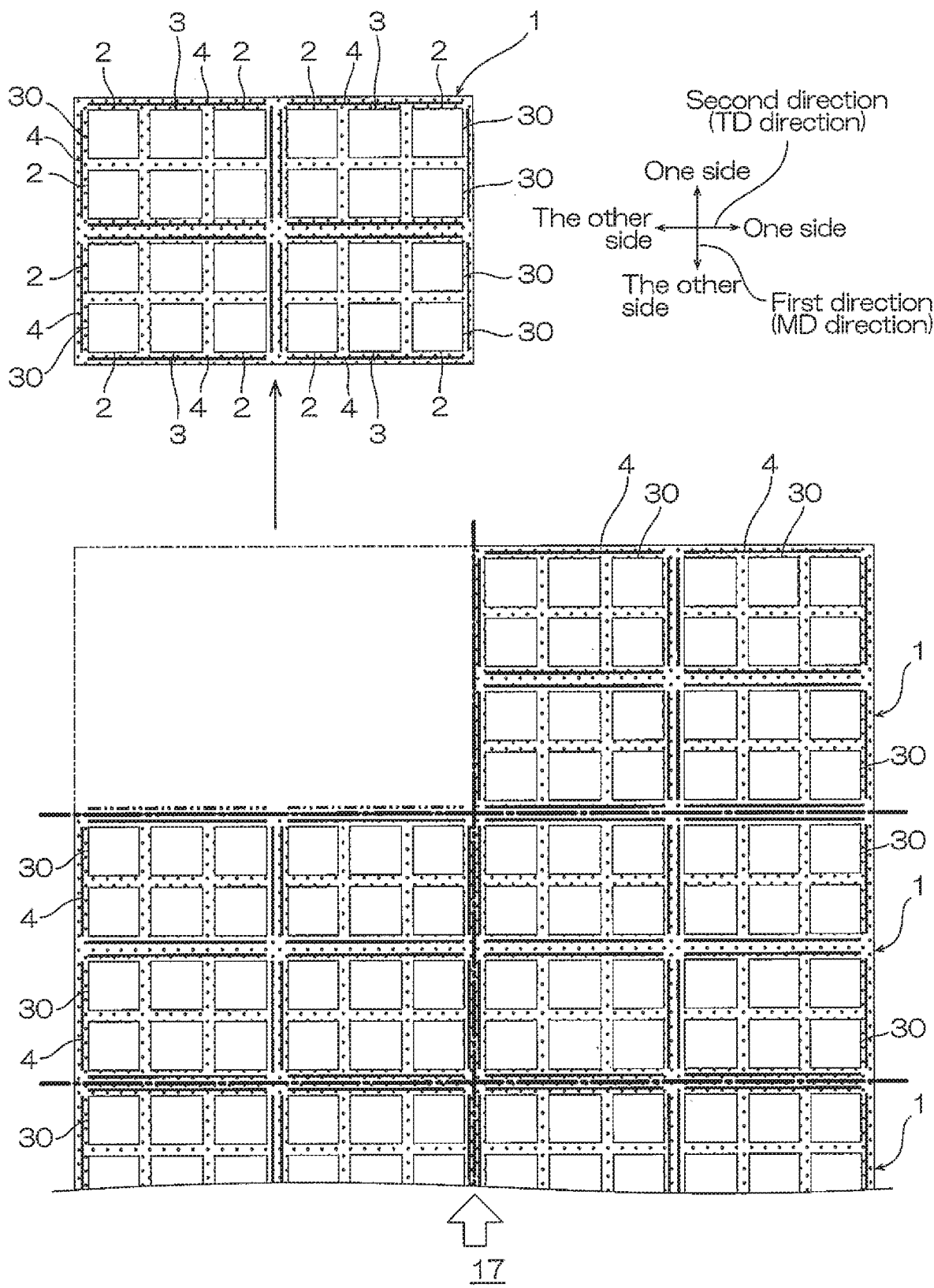
FIG. 1 shows a plan view of a long-length board including an imaging element-mounting board that is a one embodiment of the present invention.
Figure 2:
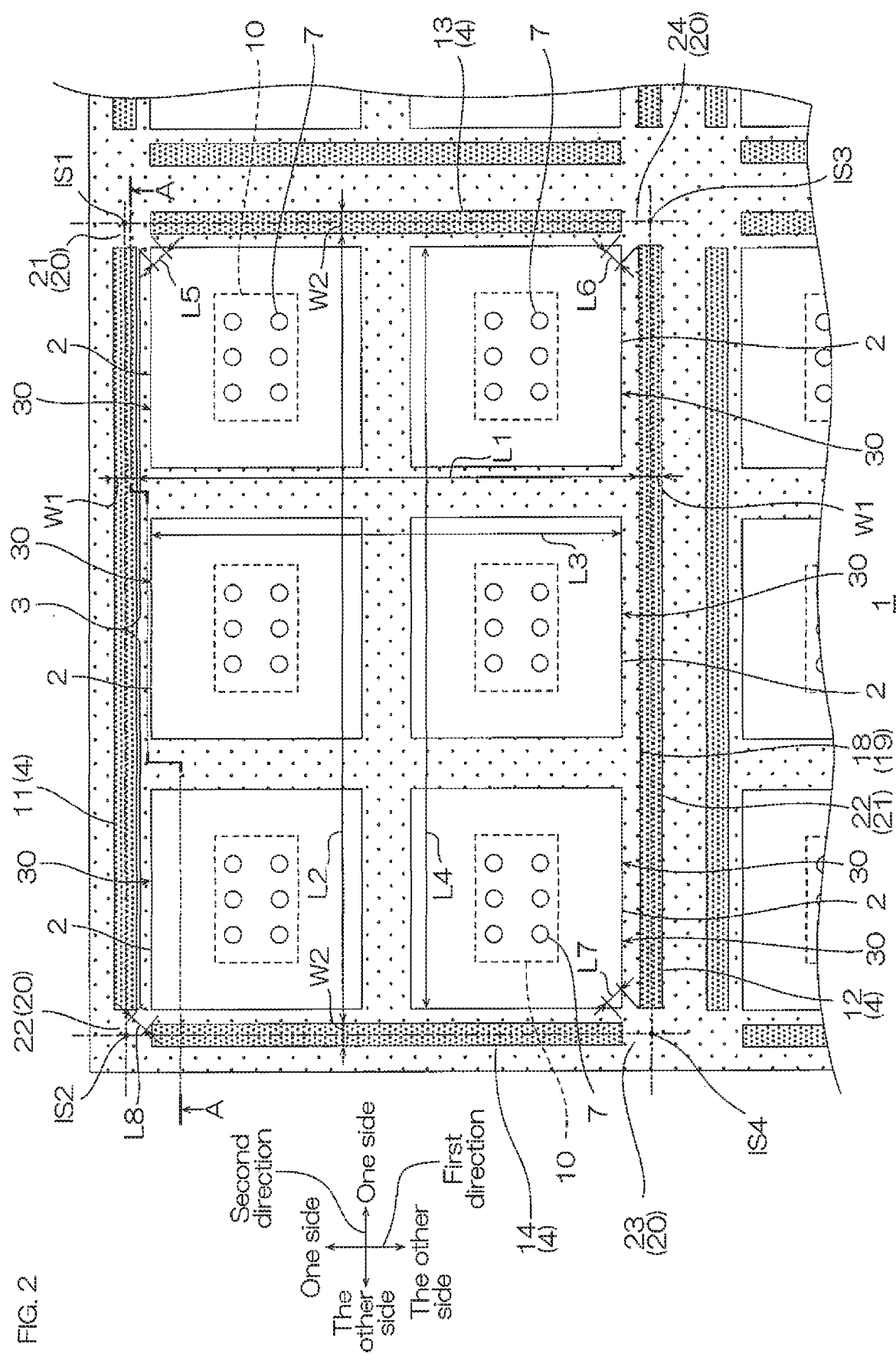
FIG. 2 shows an enlarged plan view of a plural board area in the imaging element-mounting board shown in FIG. 1.

As shown by an upper-left view of FIG. 1, and FIG. 2, an imaging element-mounting board 1 has a flat plate shape extending in a first direction perpendicular to a thickness direction, and to be specific, has a predetermined thickness, and has a flat front surface and a flat rear surface. The imaging element-mounting board 1 is obtained by cutting a long-length board 17 extending in the first direction (having a long length) and having the above-described imaging element-mounting boards 1 disposed in alignment along the first direction and a second direction (direction perpendicular to the thickness direction and the first direction). The imaging element-mounting board 1 includes a plurality of boards 30 that is mounted with one imaging element to be described next. The first direction and the second direction described above are included in a plane direction.

The imaging element-mounting board 1 is not an imaging device (not shown), and is one component of the imaging device (not shown), that is, a component for fabricating the imaging device (not shown). The imaging element-mounting board 1 does not include an imaging element (not shown), and is an industrially available device whose component alone is circulated.

As shown by the upper-left view of FIG. 1, the imaging element-mounting board 1 includes a plurality of plural board areas 3.

The plural board area 3 is an area in a generally rectangular shape when viewed from the top, and in the one imaging element-mounting board 1, the plurality of plural board areas 3, to be specific, the total of four plural board areas 3 (=2×2) of two rows along the first direction and two rows along the second direction are disposed in alignment at spaced intervals to each other in each of the first direction and the second direction.

Each of the plurality of plural board areas 3 is an area in which the plurality of boards 30 are assembled.

The board 30 has a generally rectangular shape when viewed from the top, and in the one plural board area 3, the plurality of boards 30, to be specific, the total of six plural boards 30 (=2×3) of two rows along the first direction and three rows along the second direction are disposed in alignment at spaced intervals to each other in each of the first direction and the second direction.

The plural board area 3 includes a plurality of board areas 2 that ensure (define) the above-described board 30.

As shown in FIG. 2, a mounting area 10 (dashed lines) is defined in the central portion in the plane direction of the board 30. The mounting area 10 is an area in a generally rectangular shape when viewed from the top that is mounted with the one imaging element (not shown).

As shown in FIGS. 2 and 3, the board 30 includes an insulating layer 5 and a terminal 7. The details of the insulating layer 5 and the terminal 7 are described later.

An auxiliary reinforcement portion 18 is provided at the inside of the plural board area 3 and the outside of the board area 2. The auxiliary reinforcement portion 18 consists of an auxiliary reinforcement layer 19 that is embedded in the insulating layer 5. The auxiliary reinforcement layer 19 is provided independently from the terminal 7, and has a generally sheet shape extending in the plane direction. The auxiliary reinforcement portion 18 has a generally lattice shape when viewed from the top between the plurality of board areas 2. The auxiliary reinforcement portion 18 assists reinforcement of the board 30 (the plural board area 3) by a reinforcement portion 4.

The auxiliary reinforcement layer 19 is also disposed in the entire area other than the reinforcement portion 4 to be described later at the outside of the plural board area 3 in the imaging element-mounting board 1. The details of a thickness, a material, or the like of the auxiliary reinforcement layer 19 are described later.

The imaging element-mounting board 1 includes the plurality of reinforcement portions 4 disposed around each of the plurality of plural board areas 3.

The reinforcement portion 4 is provided corresponding to each of the sides of the plural board area 3. To be specific, the four reinforcement portions 4 are provided corresponding to the four sides of the one plural board area 3. The four reinforcement portions 4 are disposed in opposed relation at minute spaced intervals to the outside in the plane direction of the four sides of the one plural board area 3. The four reinforcement portions 4 are independent from each other.

The four reinforcement portions 4 consist of a first reinforcement portion 11 and a second reinforcement portion 12 facing each other in the first direction, and a third reinforcement portion 13 and a fourth reinforcement portion 14 facing each other in the second direction.

The first reinforcement portion 11 is disposed in opposed relation at spaced intervals to one side in the first direction of the one plural board area 3. The first reinforcement portion 11 has a generally linear shape extending along the second direction. That is, the first reinforcement portion 11 has a width W1 that is the same over the second direction. Each of both end edges in the second direction of the first reinforcement portion 11 is overlapped with each of both end edges in the second direction of the plural board area 3 when projected in the first direction.

The second reinforcement portion 12 is disposed in opposed relation at spaced intervals to the other side in the first direction of the one plural board area 3. The second reinforcement portion 12 has a generally linear shape extending along the second direction. That is, the second reinforcement portion 12 has the same width W1 as the description above over the second direction. Each of both end edges in the second direction of the second reinforcement portion 12 is overlapped with each of both end edges in the second direction of the plural board area 3 when projected in the first direction.

In this manner, the first reinforcement portion 11 faces the second reinforcement portion 12 in the first direction with the plural board area 3 sandwiched therebetween. Each of both end edges in the second direction of the first reinforcement portion 11 is overlapped with each of both end edges in the second direction of the second reinforcement portion 12 when projected in the first direction.

The third reinforcement portion 13 is disposed in opposed relation at spaced intervals to one side in the second direction of the one plural board area 3. The third reinforcement portion 13 has a generally linear shape extending along the first direction. That is, the third reinforcement portion 13 has a width W2 that is the same over the first direction. Each of both end edges in the first direction of the third reinforcement portion 13 is overlapped with each of both end edges in the first direction of the plural board area 3 when projected in the second direction.

The fourth reinforcement portion 14 is disposed in opposed relation at spaced intervals to the other side in the second direction of the one plural board area 3. The fourth reinforcement portion 14 has a generally linear shape extending along the first direction. That is, the fourth reinforcement portion 14 has the same width W2 as the description above over the first direction. Each of both end edges in the first direction of the fourth reinforcement portion 14 is overlapped with each of both end edges in the first direction of the plural board area 3 when projected in the second direction.

In this manner, the third reinforcement portion 13 faces the fourth reinforcement portion 14 in the second direction with the plural board area 3 sandwiched therebetween. Each of both end edges in the first direction of the third reinforcement portion 13 is overlapped with each of both end edges in the first direction of the fourth reinforcement portion 14 when projected in the second direction.

Meanwhile, the reinforcement portion 4 is not formed in a portion corresponding to an intersection point IS (a defective portion 20), while a phantom line passing each of the reinforcement portions 4 that are next to each other is disposed so as to have the intersection point IS.

To be specific, the reinforcement portion 4 is not formed in a portion corresponding to an intersection point IS1 (a first defective portion 21), while a phantom line passing each of the first reinforcement portion 11 and the third reinforcement portion 13 is disposed so as to have the intersection point IS1.

Also, the reinforcement portion 4 is not formed in a portion corresponding to an intersection point IS2 (a second defective portion 22), while a phantom line passing each of the first reinforcement portion 11 and the fourth reinforcement portion 14 is disposed so as to have the intersection point IS2.

Furthermore, the reinforcement portion 4 is not formed in a portion corresponding to an intersection point IS3 (a third defective portion 23), while a phantom line passing each of the second reinforcement portion 12 and the third reinforcement portion 13 is disposed so as to have the intersection point IS3.

Moreover, the reinforcement portion 4 is not formed in a portion corresponding to an intersection point IS4 (a fourth defective portion 24), while a phantom line passing each of the second reinforcement portion 12 and the fourth reinforcement portion 14 is disposed so as to have the intersection point IS4.

In short, the four reinforcement portions 4 have a discontinuous pattern that is discontinuous in a circumferential direction in which only the four apex portions in a generally rectangular frame shape when viewed from the top are not formed, and a portion other than the four apex portions is formed. The four apex portions correspond to the above-described four defective portions 20 (the first defective portion 21, the second defective portion 22, the third defective portion 23, and the fourth defective portion 24), and the portion other than the four apex portions corresponds to the four reinforcement portions 4.

A ratio (W1/L1) of the width W1 of each of the first reinforcement portion 11 and the second reinforcement portion 12 to a distance L1 between the first reinforcement portion 11 and the second reinforcement portion 12 is, for example, 0.005 or more, preferably 0.01 or more, and for example, 0.5 or less, preferably 0.2 or less. A ratio (W2/L2) of the width W2 of each of the third reinforcement portion 13 and the fourth reinforcement portion 14 to a distance L2 between the third reinforcement portion 13 and the fourth reinforcement portion 14 is, for example, 0.005 or more, preferably 0.01 or more, and for example, 0.5 or less, preferably 0.2 or less.

A ratio (L1/L3) of the distance L1 between the first reinforcement portion 11 and the second reinforcement portion 12 to a length L3 in the first direction of the plural board area 3 is, for example, 1.001 or more, preferably 1.005 or more, and for example, 1.2 or less, preferably 1.1 or less. A ratio (L2/L4) of the distance L2 between the third reinforcement portion 13 and the fourth reinforcement portion 14 to a length L4 in the second direction of the plural board area 3 is, for example, 1.001 or more, preferably 1.005 or more, and for example, 1.2 or less, preferably 1.1 or less.

A ratio (L5/(L3+L4)) of the shortest distance L5 between the first reinforcement portion 11 and the third reinforcement portion 13 to the total sum (L3+L4) of the length L3 in the first direction and the length L4 in the second direction of the plural board area 3 is, for example, 0.005 or more, preferably 0.008 or more, and for example, 0.5 or less, preferably 0.3 or less. A ratio (L6/(L3+L4)) of the shortest distance L6 between the second reinforcement portion 12 and the third reinforcement portion 13 to the above-described total sum (L3+L4), a ratio (L7/(L3+L4)) of the shortest distance L7 between the second reinforcement portion 12 and the fourth reinforcement portion 14 to the above-described total sum (L3+L4), and a ratio (L8/(L3+L4)) of the shortest distance L8 between the first reinforcement portion 11 and the fourth reinforcement portion 14 to the above-described total sum (L3+L4) are the same as the above-described ratio (L5/(L3+L4)).

The reinforcement portion 4 consists of a reinforcement layer 15. The details of the reinforcement layer 15 are described next.

As shown in FIGS. 2 and 3, the imaging element-mounting board 1 includes the insulating layer 5, the terminal 7, the auxiliary reinforcement layer 19, and the reinforcement layer 15.

The insulating layer 5 has a sheet (film) shape, and supports the terminal 7 so as to be insulated. The insulating layer 5 sequentially includes a base insulating layer 6 and a cover insulating layer 8 toward one side in the thickness direction. Examples of a material for the insulating layer 5 include resins such as polyimide. That is, as the insulating layer 5, a resin sheet (resin film) having flexibility is used. A thermal contraction rate of the insulating layer 5 is represented as a linear expansion coefficient, and is, for example, 50 ppm or less, preferably 30 ppm or less, and for example, 3 ppm or more, preferably 10 ppm or more. The insulating layer 5 has a thickness of, for example, 2 μm or more, preferably 10 μm or more, and for example, 50 μm or less, preferably 20 μm or less.

As shown in FIG. 2, the terminal 7 fills a through hole (not shown) provided in the insulating layer 5. The plurality of terminals 7 are disposed in alignment at the inside of the mounting area 10. The terminal 7 is electrically connected to an external terminal (not shown) via a wire that is not shown. The wire (not shown) is embedded in the insulating layer 5. Examples of a material for the terminal 7 and the wire (not shown) include conductors such as copper. The terminal 7 and the wire (not shown) have a thickness of, for example, 1 μm or more, preferably 3 μm or more, and for example, 15 μm or less, preferably 10 μm or less.

The auxiliary reinforcement layer 19 is embedded in the insulating layer 5. To be specific, the auxiliary reinforcement layer 19 is disposed on a one-side surface in the thickness direction of the base insulating layer 6 so as to be covered by the cover insulating layer 8. An other-side surface in the thickness direction of the auxiliary reinforcement layer 19 is in contact with the one-side surface in the thickness direction of the base insulating layer 6. The one-side surface in the thickness direction and both side surfaces in the plane direction of the auxiliary reinforcement layer 19 are in contact with the cover insulating layer 8.

Examples of a material for the auxiliary reinforcement layer 19 include materials having toughness. Examples thereof include metal materials such as copper, silver, gold, nickel, and an alloy thereof, and solder. Preferably, copper is used. When the material for the auxiliary reinforcement layer 19 is copper, and when the material for the terminal 7 and the wire (not shown) is copper, the auxiliary reinforcement layer 19 can be formed simultaneously with the forming of these.

The auxiliary reinforcement portion 18 assists the reinforcement of the board 30 by the reinforcement portion 4, so that the rigidity of the auxiliary reinforcement layer 19 is lower than that of the reinforcement layer 15. To be specific, a ratio (E2/E1) of a Young's modulus E2 at 25° C. of the auxiliary reinforcement layer 19 to a Young's modulus E1 at 25° C. of the reinforcement layer 15 is, for example, above 1, preferably 1.2 or more, more preferably 1.3 or more, and for example, 10 or less.

The thickness of the auxiliary reinforcement layer 19 is the same as that of the above-described wire (not shown), and is, for example, 0.5 μm or more, preferably 2 μm or more, and for example, 20 μm or less, preferably 12 μm or less, more preferably 8 μm or less.

The thickness of the plural board area 3 is calculated as the maximum thickness of the plural board area 3, and to be specific, corresponds to the total thickness of the insulating layer 5 and the auxiliary reinforcement layer 19. To be specific, the plural board area 3 has a thickness of, for example, 50 μm or less, preferably 40 μm or less, more preferably 30 μm or less, and for example, 10 μm or more.

When the above-described thickness is the above-described upper limit or less, a reduction in thickness can be achieved. Meanwhile, when the above-described thickness is the above-described upper limit or less, a sag (deformation) in the plural board area 3 (the board area 2) can be easily produced in a producing step to be described later. However, the reinforcement portion 4 is not formed in the above-described defective portion 20, so that the above-described generation of the sag (deformation) can be suppressed.

The reinforcement layer 15 is disposed on the lower surface of the insulating layer 5 in a pattern of forming the reinforcement portion 4. To be more specific, the reinforcement layer 15 is in contact with the other-side surface in the thickness direction of the base insulating layer 6. Meanwhile, the other-side surface in the thickness direction of the base insulating layer 6 is exposed from the inside and the outside in the plane direction of the reinforcement layer 15.

An example of a material for the reinforcement layer 15 includes a material having rigidity. Examples thereof include metals such as stainless steel, 42-alloy, aluminum, and copper alloy; resins; and ceramics. Preferably, a metal is used.

The thermal contraction rate of the reinforcement layer 15 is represented as the linear expansion coefficient, and is, for example, 30 ppm or less, preferably 20 ppm or less, and for example, 1 ppm or more, preferably 5 ppm or more.

The reinforcement layer 15 has a thickness of, for example, 5 µm or more, preferably 10 µm or more, and for example, 50 µm or less, preferably 30 µm or less. A ratio (thickness of the reinforcement layer 15/thickness of the insulating layer 5) of the thickness of the reinforcement layer 15 to that of the insulating layer 5 is, for example, 0.3 or more, preferably 1 or more, and for example, 10 or less, preferably 5 or less. Furthermore, a ratio (thickness of the reinforcement layer 15/thickness of the auxiliary reinforcement layer 19) of the thickness of the reinforcement layer 15 to that of the auxiliary reinforcement layer 19 is, for example, 1 or more, preferably 2 or more, and for example, 10 or less, preferably 5 or less.

Next, a method for producing the imaging element-mounting board 1 is described. In the production of the imaging element-mounting board 1, for example, a roll-to-roll method in which the imaging element-mounting board 1 is conveyed in the first direction (MD direction) is used.

First, in this method, a reinforcement plate 25 (ref: phantom line of FIG. 3) for forming the reinforcement layer 15 is prepared. The reinforcement plate 25 has the same properties as those of the above-described reinforcement layer 15, and has a long-length plate shape extending in the first direction. The reinforcement plate 25 is a supporting plate that prevents the deformation of the insulating layer 5.

Next, the base insulating layer 6 is formed on the entire one-side surface in the thickness direction of the reinforcement plate 25. For example, first, a photosensitive insulating composition containing a photosensitive component and an insulator is prepared, and subsequently, the photosensitive insulating composition is applied to the one-side surface in the thickness direction of the reinforcement plate 25 to be then dried as needed, thereby forming a film. Next, the film is exposed to light via a photomask and developed to be then heated after exposure to light.

By the above-described heating after exposure to light, the contractive force is generated between the reinforcement plate 25 and the base insulating layer 6 caused by the difference of the thermal contraction rate of these. However, the reinforcement plate 25 is disposed on the entire other-side surface in the thickness direction of the base insulating layer 6, so that the deformation caused by the contractive force of the base insulating layer 6 can be suppressed by the supporting force of the reinforcement plate 25.

Next, the terminal 7, the wire (not shown), the external terminal (not shown), and the auxiliary reinforcement layer 19 are, for example, formed on the one-side surface in the thickness direction of the base insulating layer 6 by an additive method, a subtractive method, or the like. In this manner, the terminal 7, the external terminal (not shown), and the wire (not shown) are formed, and the auxiliary reinforcement portion 18 that is independent from these and consists of the auxiliary reinforcement layer 19 is formed.

Next, the cover insulating layer 8 is formed on the one-side surface in the thickness direction of the base insulating layer 6 so as to expose the one-side surface in the thickness direction of the terminal 7 and the external terminal (not shown) and to cover the wire (not shown). For example, first, the photosensitive insulating composition containing the photosensitive component and the insulator is prepared, and subsequently, the photosensitive insulating composition is applied to the one-side surface in the thickness direction of the reinforcement plate 25 so as to cover the terminal 7, the wire (not shown), and the auxiliary reinforcement portion 18 to be then dried as needed, thereby forming the film. Next, the film is exposed to light via the photomask having a pattern corresponding to the terminal 7 and the external terminal (not shown) and developed to be then heated after exposure to light.

By the above-described heating after exposure to light, the contractive force is generated between the reinforcement plate 25 and the cover insulating layer 8 caused by the difference of the thermal contraction rate of these. However, the reinforcement plate 25 is disposed on the entire other-side surface in the thickness direction of the base insulating layer 6, so that the deformation of the cover insulating layer 8 is suppressed by being supported by the reinforcement plate 25 via the base insulating layer 6.

Thereafter, the reinforcement plate 25 is trimmed, so that the reinforcement portion 4 consisting of the reinforcement layer 15 is formed. The trimming of the reinforcement plate 25 is not particularly limited, and examples thereof include etching such as wet etching and dry etching, and laser processing. Preferably, etching is used, more preferably, wet etching using an etching resist is used.

By the trimming of the reinforcement plate 25, the supporting of the insulating layer 5 in the plural board area 3 is removed (the supporting is lost). Thus, the plural board area 3 (the insulating layer 5 therein) easily sags (is easily deformed) caused by the contractive force.

However, the above-described deformation is suppressed by the plurality of reinforcement portions 4 that are independent from each other.

In this manner, the long-length board 17 in which the plurality of imaging element-mounting boards 1 are disposed along the first direction (MD direction) is obtained.

Thereafter, as shown by one-dot chain lines of FIG. 1, the long-length board 17 is cut along the first direction (MD direction) and the second direction (TD direction) by dicing or the like, so that the imaging element-mounting boards 1 are singulated.

In this manner, as referred to the upper-left view of FIG. 1, the imaging element-mounting boards 1 each including the plurality of plural board areas 3 are obtained.

Thereafter, the imaging element (not shown) is mounted on each of the plurality of board areas 2 (the mounting area 10) in each of the plurality of plural board areas 3.

Thereafter, furthermore, the imaging element-mounting boards 1 that are mounted with the plurality of imaging elements are cut along the first direction and the second direction by the dicing or the like so that the imaging elements and the board areas 2 are singulated.

In the imaging element-mounting board 1, the plural board area 3 including the board area 2 is reinforced by the plurality of reinforcement portions 4, so that the generation of the creases and the wrinkles in the plural board area 3 can be reduced. At the same time, the plurality of reinforcement portions 4 are independent from each other, so that there is no reinforcement portion 4 between the plurality of reinforcement portions 4 (the defective portion 20). Thus, the contractive force generated in the plural board area 3 can be released (dispersed) from the defective portion 20.

Thus, the deformation caused by the contractive force in the plural board area 3 can be suppressed.

As a result, the imaging element-mounting board 1 has excellent handleability and can accurately mount the imaging element (not shown) thereon, while reducing the generation of the creases and the wrinkles in the plural board area 3.

In the imaging element-mounting board 1, the plurality of reinforcement portions 4 include the reinforcement portions 4 facing each other with the board area 1 sandwiched therebetween in the plane direction, so that the deformation caused by the contractive force can be suppressed, while the generation of the creases and the wrinkles at the time of handling of the plural board area 3 is suppressed.

In the imaging element-mounting board 1, the board area 2 is the plural board area 3 in which the plurality of boards 30 are disposed in alignment in the plane direction, so that the plurality of boards 30 can be collectively reinforced.

Furthermore, in the imaging element-mounting board 1, the plurality of reinforcement portions 4 are disposed corresponding to each of the sides of the plural board area 3, so that the plurality of boards 30 can be efficiently reinforced.

In the imaging element-mounting board 1, the plurality of boards 30 can be collectively reinforced by the reinforcement portion 4, while the board 30 at the inside of the plural board area 3 is reinforced by the auxiliary reinforcement portion 18.

In the imaging element-mounting board 1, the reinforcement portion 4 is not formed in the defective portion 20 corresponding to the intersection point IS, so that the contractive force generated in the plural board area 3 can be released in the two directions, that is, both of the first direction and the second direction along the two reinforcement portions 4 corresponding to the intersection point IS and having a generally linear shape.

To be specific, the contractive force can be released in the two directions along the first reinforcement portion 11 and the third reinforcement portion 13 corresponding to the intersection point IS1. Also, the contractive force can be released in the two directions along the first reinforcement portion 11 and the fourth reinforcement portion 14 corresponding to the intersection point IS2. Also, the contractive force can be released in the two directions along the second reinforcement portion 12 and the third reinforcement portion 13 corresponding to the intersection point IS3. Furthermore, the contractive force can be released in the two directions along the second reinforcement portion 12 and the fourth reinforcement portion 14 corresponding to the intersection point IS4.

In the imaging element-mounting board 1, the material for the plurality of reinforcement portions 4 is the metal, and when the board area 2 includes the resin film, the difference of the contraction rate (thermal expansion coefficient or the like) between the metal and the resin is large, and thus, the above-described contractive force is easily generated.

As described above, however, the plurality of reinforcement portions 4 are independent from each other, so that the contractive force can be released. As a result, the deformation caused by the contractive force can be suppressed. Accordingly, the imaging element-mounting board 1 has excellent handleability, and the imaging element can be accurately mounted thereon.

In the imaging element-mounting board 1, when the thickness of the plural board area 3 (the board area 2) is thin of 50 µm or less, a reduction in thickness thereof can be achieved.

Meanwhile, in the thin plural board area 3, the above-described contractive force is easily generated. As described above, however, the reinforcement portion 4 is not formed in the defective portion 20, so that the contractive force can be released. Thus, the deformation caused by the contractive force can be suppressed. As a result, the imaging element-mounting board 1 has excellent handleability, and the imaging element (not shown) can be accurately mounted thereon.

[Modified Examples]

In modified examples, the same reference numerals are provided for members and steps corresponding to each of those in the one embodiment, and their detailed description is omitted. Furthermore, the modified examples can achieve the same function and effect as that of the one embodiment unless otherwise specified.

The imaging element-mounting board 1 can be also constituted (produced in advance) as one sheet (plate) produced by a single wafer processing method instead of the long-length board 17 produced by a roll-to-roll method.

The mounting order of the imaging element is not limited to the description above, and for example, the imaging element can be also mounted on the long-length board 17 before the dicing. Furthermore, the imaging element can be also mounted on each of the plurality of boards 30 obtained by singulating the plurality of plural board areas 3.

The reinforcement portion 4 may be disposed corresponding to each of the sides of the plural board area 3, and the plurality of reinforcement portions 4 may be, for example, provided in each of the sides.

Figure 4:
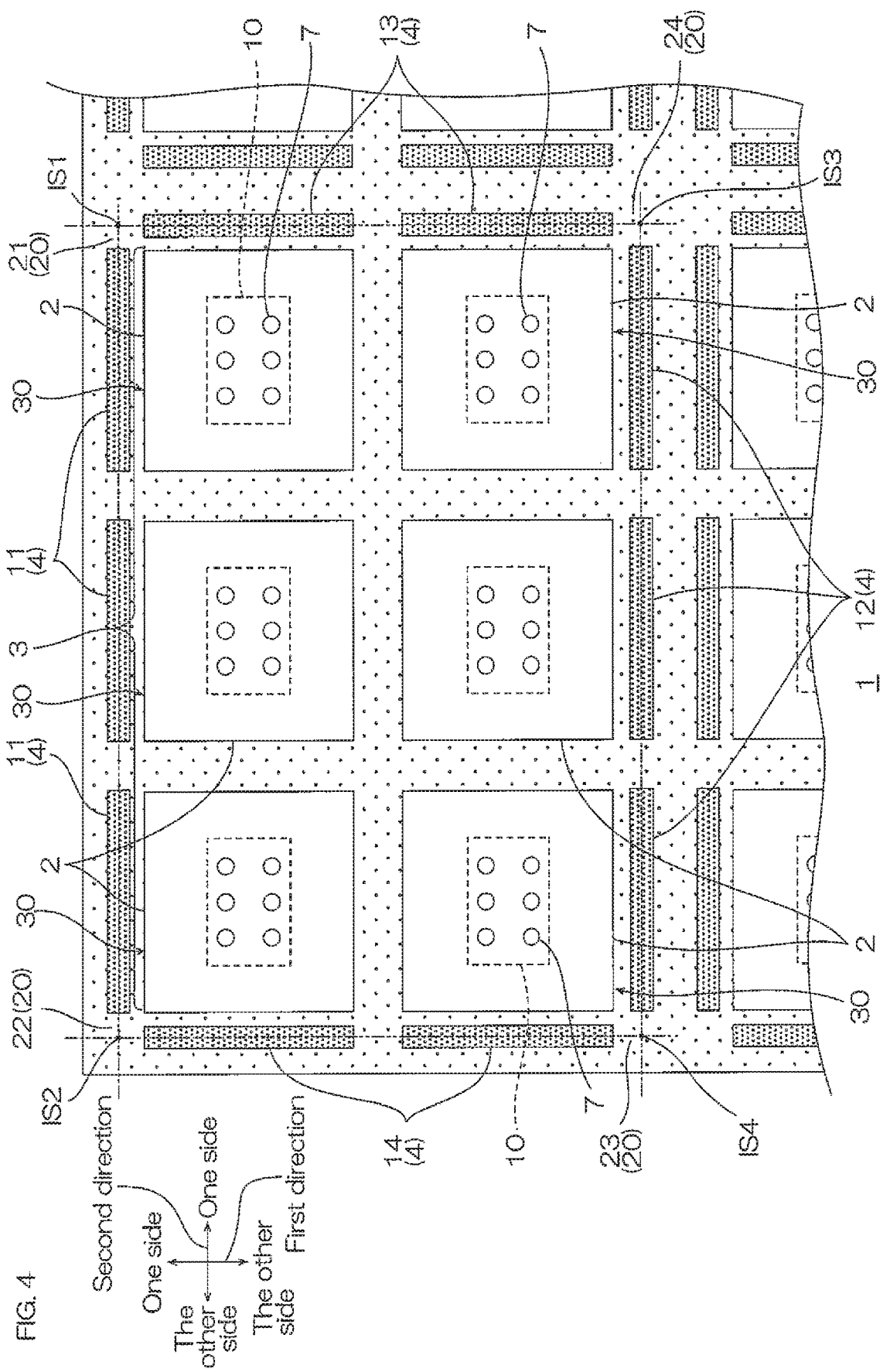
FIG. 4 shows a plan view of a modified example of an imaging element-mounting board of the present invention.

As shown in FIG. 4, for example, the plurality of (for example, three) first reinforcement portions 11 are provided with respect to the side at one side in the first direction of the plural board area 3. The plurality of first reinforcement portions 11 are disposed at spaced intervals in the second direction. Each of the plurality of first reinforcement portions 11 is positioned on the same phantom line. Each of the plurality of first reinforcement portions 11 is provided corresponding to the plurality of (for example, three) boards 30 disposed at one side in the first direction in the plural board area 3. That is, each of the plurality of first reinforcement portions 11 is provided in one-to-one correspondence with each of the plurality of boards 30 disposed at one side in the first direction of the plural board area 3.

The plurality of (for example, three) second reinforcement portions 12 are provided with respect to the side at the other side in the first direction of the plural board area 3. The plurality of second reinforcement portions 12 are disposed at spaced intervals in the second direction. Each of the plurality of second reinforcement portions 12 is positioned on the same phantom line. Each of the plurality of second reinforcement portions 12 is provided corresponding to the plurality of (for example, three) boards 30 disposed at the other side in the first direction in the plural board area 3. That is, each of the plurality of second reinforcement portions 12 is provided in one-to-one correspondence with each of the plurality of boards 30 disposed at the other side in the first direction of the plural board area 3.

The plurality of (for example, two) third reinforcement portions 13 are provided with respect to the side at one side in the second direction of the plural board area 3. The plurality of third reinforcement portions 13 are disposed at spaced intervals in the first direction. Each of the plurality of third reinforcement portions 13 is positioned on the same phantom line. Each of the plurality of third reinforcement portions 13 is provided corresponding to the plurality of (for example, two) boards 30 disposed at one side in the second direction in the plural board area 3. That is, each of the plurality of third reinforcement portions 13 is provided in one-to-one correspondence with each of the plurality of boards 30 disposed at one side in the second direction of the plural board area 3.

The plurality of (for example, two) fourth reinforcement portions 14 are provided with respect to the side at the other side in the second direction of the plural board area 3. The plurality of fourth reinforcement portions 14 are disposed at spaced intervals in the first direction. Each of the plurality of fourth reinforcement portions 14 is positioned on the same phantom line. Each of the plurality of fourth reinforcement portions 14 is provided corresponding to the plurality of (for example, two) boards 30 disposed at the other side in the second direction in the plural board area 3. That is, each of the plurality of fourth reinforcement portions 14 is provided in one-to-one correspondence with each of the plurality of boards 30 disposed at the other side in the second direction of the plural board area 3.

In the one embodiment, as shown in FIG. 2, generally the frame shape for constituting the reinforcement portion 4 is a generally rectangular shape. However, though not shown, the plurality of reinforcement portions 4 can also have a pattern in which only the apex portions in a frame shape of polygonal shape (for example, triangular shape, hexagonal shape, or the like) excluding the rectangular shape are not formed.

Figure 5:
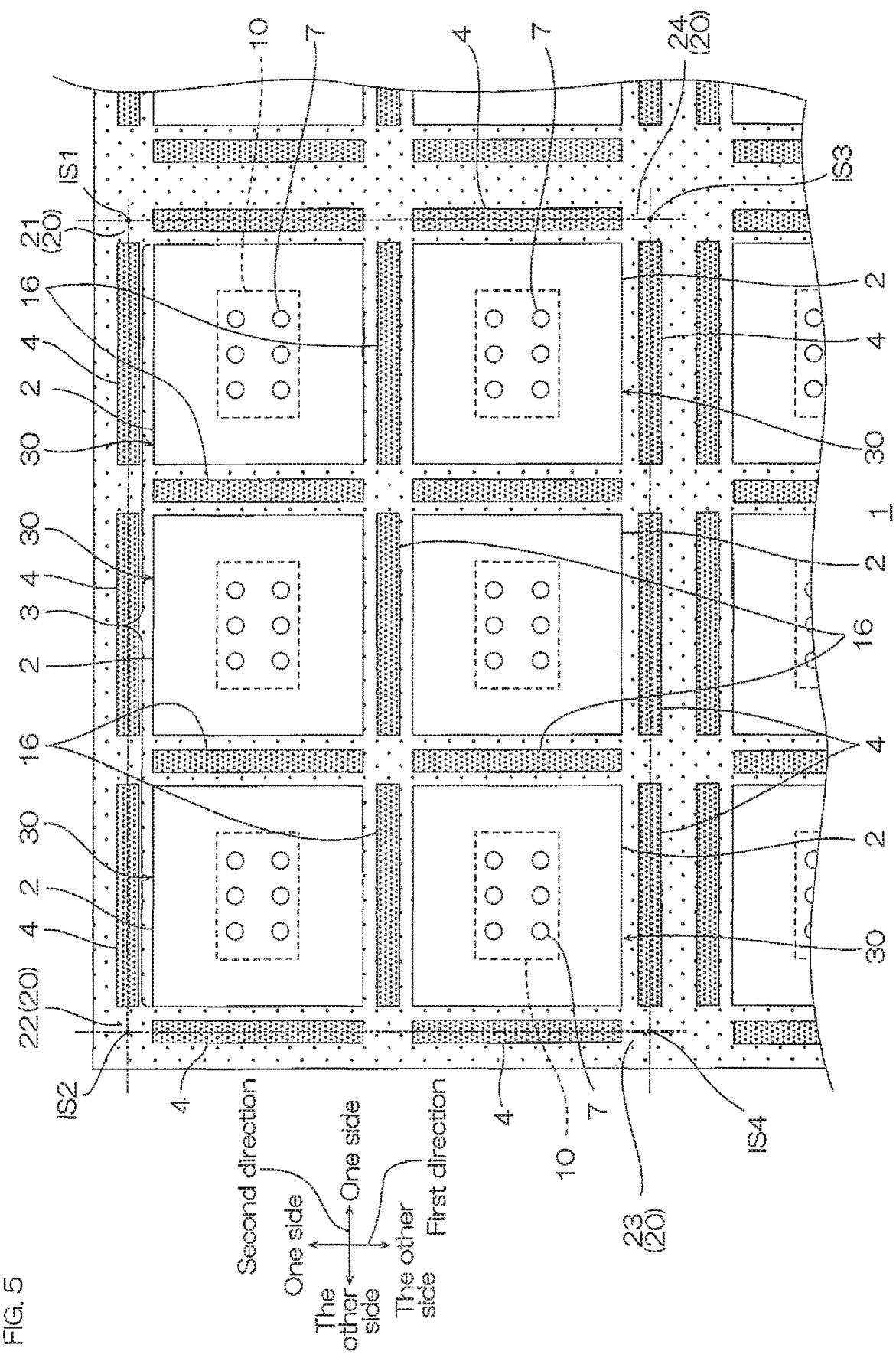
FIG. 5 shows a plan view of a modified example of an imaging element-mounting board of the present invention.

As shown in FIG. 5, the imaging element-mounting board 1 can also further include a plurality of first inner-side reinforcement portions 16 that are disposed at the inside of the plural board area 3. The plurality of first inner-side reinforcement portions 16 are disposed so as to be sandwiched (sandwiched or interlaid) between the plurality of board areas 2 that are next to each other in the first direction and the second direction. The first inner-side reinforcement portion 16 has the same shape when viewed from the top as that of the reinforcement portion 4. A material and a layer structure of the first inner-side reinforcement portion 16 are the same as those of the reinforcement portion 4.

In this manner, the four first inner-side reinforcement portions 16 and the reinforcement portions 4 are disposed corresponding to the four sides of the one board area 2.

Figure 6:
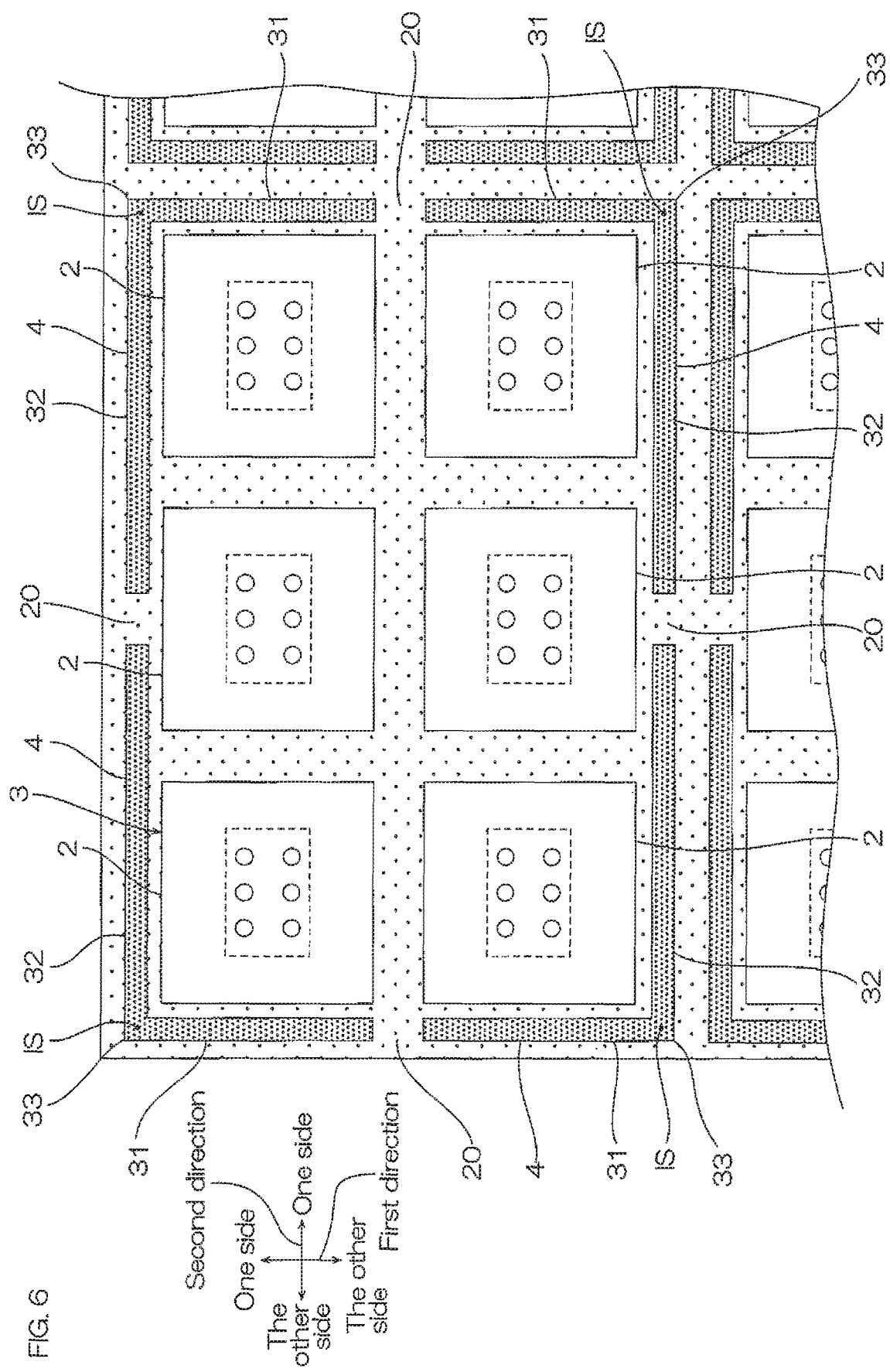
FIG. 6 shows a plan view of a modified example of an imaging element-mounting board of the present invention.

As shown in FIG. 6, the defective portion 20 can be also provided corresponding to only the central portion of each of the four sides of the plural board area 3 instead of the intersection point IS. That is, in the intersection point IS, the reinforcement portion 4 is provided instead of the defective portion 20.

In the modified example, each of the plurality of reinforcement portions 4 has an L-shape when viewed from the top. To be specific, each of the plurality of reinforcement portions 4 includes a first linear portion 31 extending along the first direction, a second linear portion 32 extending along the second direction, and a connecting portion 33 that connects the first linear portion 31 to the second linear portion 32. The connecting portion 33 is disposed on the intersection point IS between the first linear portion 31 and the second linear portion 32.

The defective portion 20 is independently disposed in a portion of the two first linear portions 31 facing each other in the first direction, and in a portion of the two second linear portions 32 facing each other in the second direction. Each of the plurality of defective portions 20 divides the plurality of (four) reinforcement portions 4.

Preferably, as shown in the one embodiment of FIG. 2, the defective portion 20 is provided on the intersection point IS. As shown in FIG. 6, when the defective portion 20 is provided in a portion of the two first linear portions 31 facing each other, and when the reinforcement portion 4 (the connecting portion 33) is provided in the intersection point IS, in the defective portion 20 in a portion of the two first linear portions 31, the contractive force can be released by only the reinforcement portion 4 extending along the first direction. When the defective portion 20 is provided in a portion of the two second linear portions 32 facing each other, in the defective portion 20 in a portion of the two second linear portions 32, the contractive force can be released by only the reinforcement portion 4 extending along the second direction.

On the other hand, as shown in FIG. 2, when the reinforcement portion 4 does not have the connecting portion 33 and the defective portion 20 is provided on the intersection point IS, the contractive force generated in the plural board area 3 can be released along the two reinforcement portions 4 corresponding to the two phantom lines constituting the intersection point IS in the one intersection point IS.

Figure 7:
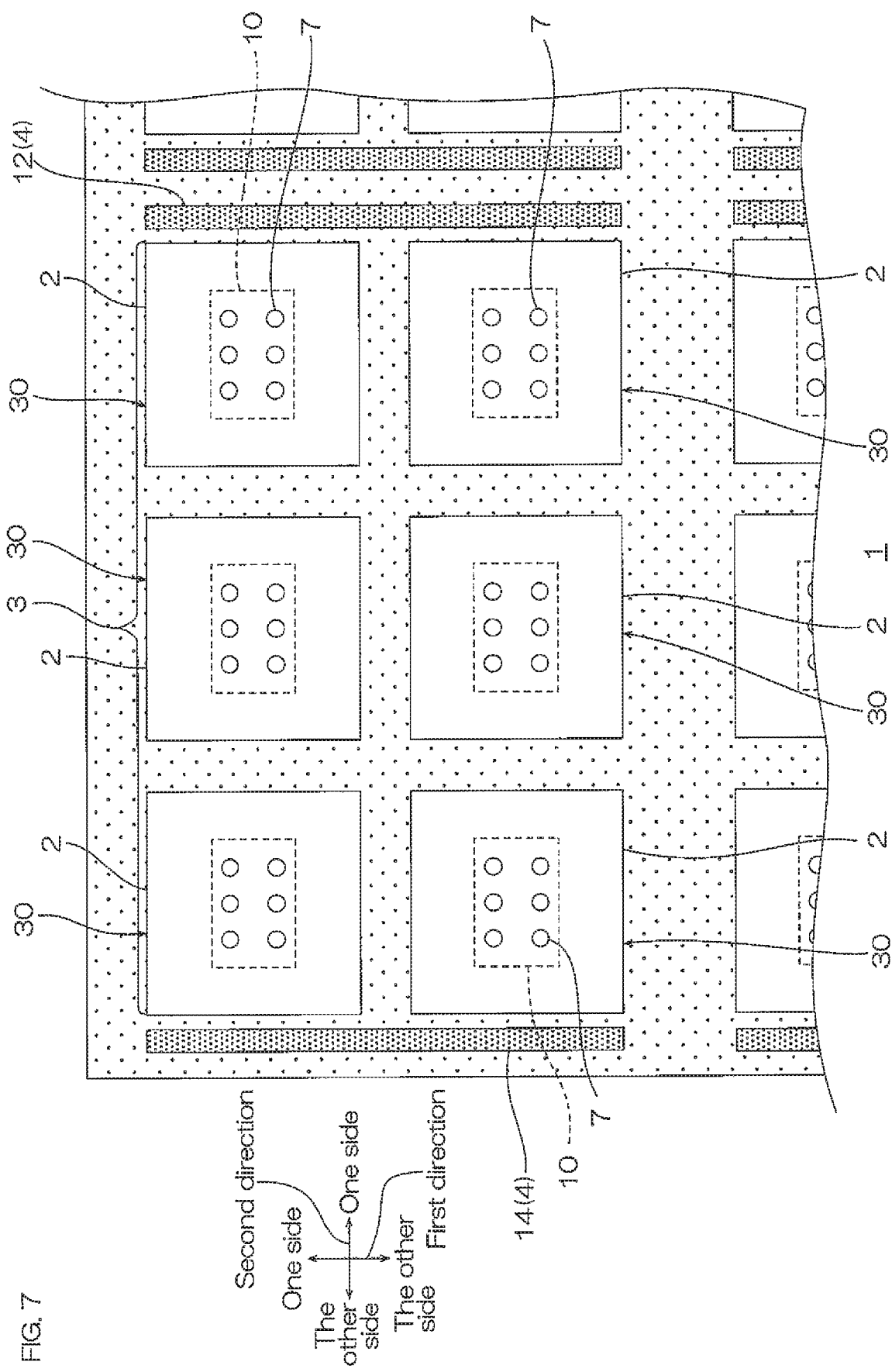
FIG. 7 shows a plan view of a modified example of an imaging element-mounting board of the present invention.
Figure 8:
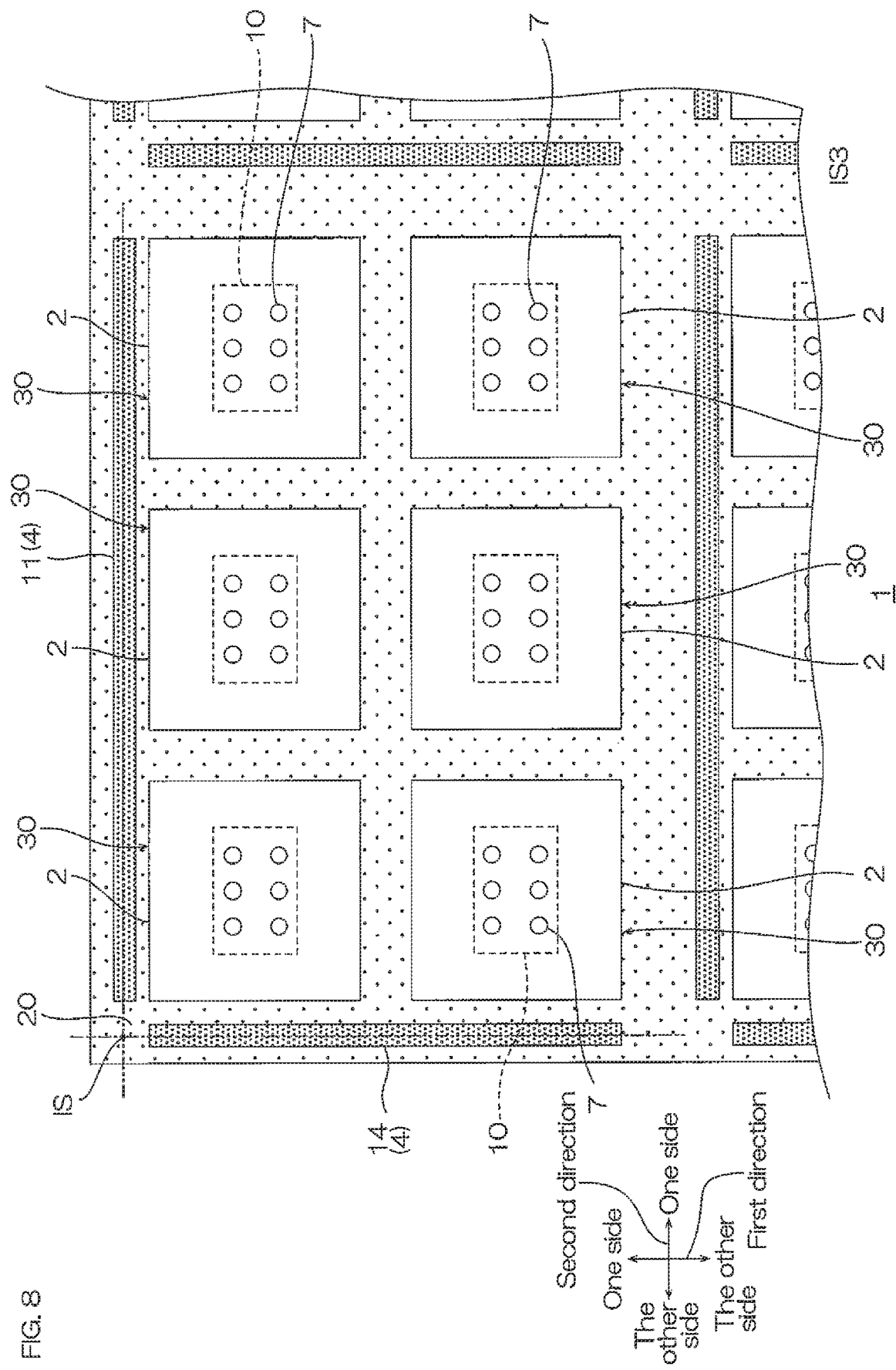
FIG. 8 shows a plan view of a modified example of an imaging element-mounting board of the present invention.

As shown in FIGS. 7 and 8, only the two reinforcement portions 4 may be also provided corresponding to the one plural board area 3.

As shown in FIG. 7, for example, the reinforcement portion 4 does not include the first reinforcement portion 11 and the third reinforcement portion 13, and consists of only the second reinforcement portion 12 and the fourth reinforcement portion 14. Alternatively, though not shown, oppositely, that is, the reinforcement portion 4 does not include the second reinforcement portion 12 and the fourth reinforcement portion 14, and can consist of only the first reinforcement portion 11 and the third reinforcement portion 13. In any modified example, the two reinforcement portions 4 are disposed in opposed relation to each other with the plural board area 3 sandwiched therebetween without constituting the intersection point IS.

As shown in FIG. 8, the reinforcement portion 4 does not include the second reinforcement portion 12 and the third reinforcement portion 13, and can consist of only the first reinforcement portion 11 and the fourth reinforcement portion 14. Furthermore, though not shown, the reinforcement portion 4 can consist of only the first reinforcement portion 11 and the third reinforcement portion 13, can consist of only the second reinforcement portion 12 and the fourth reinforcement portion 14, and furthermore, can consist of only the second reinforcement portion 12 and the third reinforcement portion 13. In any modified example, only the one intersection point IS is formed, and the reinforcement portion 4 is not formed in the defective portion 20 corresponding to the intersection point IS.

Of the modified examples of FIGS. 7 and 8, preferably, as shown in FIG. 7, the two reinforcement portions 4 are disposed in opposed relation to each other with the plural board area 3 sandwiched therebetween. When the two reinforcement portions 4 are disposed in opposed relation to each other with the plural board area 3 sandwiched therebetween, the deformation caused by the contractive force can be suppressed, while the generation of the creases and the wrinkles at the time of handling of the plural board area 3 is suppressed.

Figure 9:
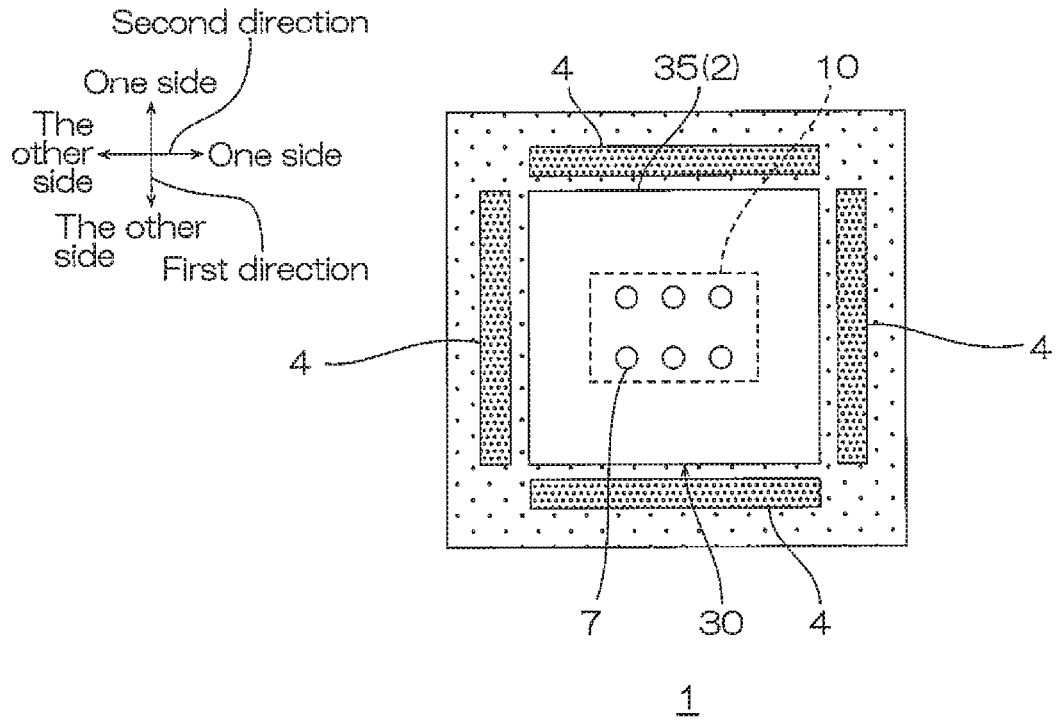
FIG. 9 shows a plan view of a modified example of a singular board area in an imaging element-mounting board of the present invention.

As shown in FIG. 9, the board area 2 is a singular board area 35 in a generally rectangular shape when viewed from the top in which the single number of (one) board 30 is disposed. The reinforcement portion 4 is disposed corresponding to each of the sides of the singular board area 35. To be specific, the four reinforcement portions 4 are disposed corresponding to the four sides of the one singular board area 35.

Figure 10:
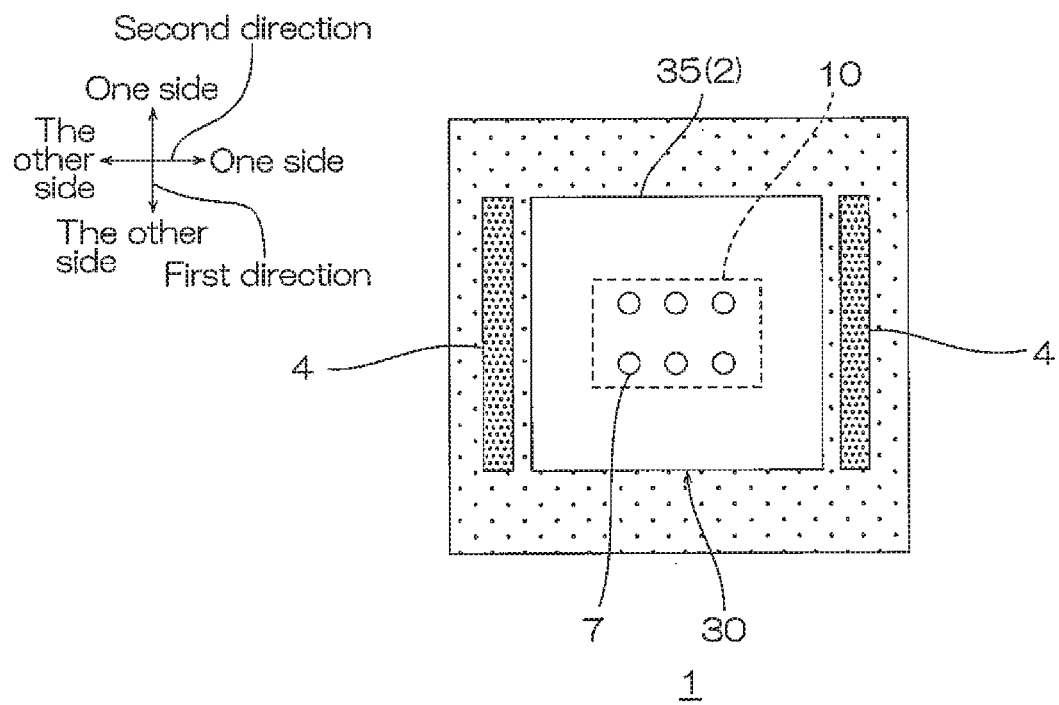
FIG. 10 shows a plan view of a modified example of a singular board area in an imaging element-mounting board of the present invention.

As shown in FIG. 10, for example, the two reinforcement portions 4 are disposed with the one board area 2 sandwiched therebetween.

Figure 11:
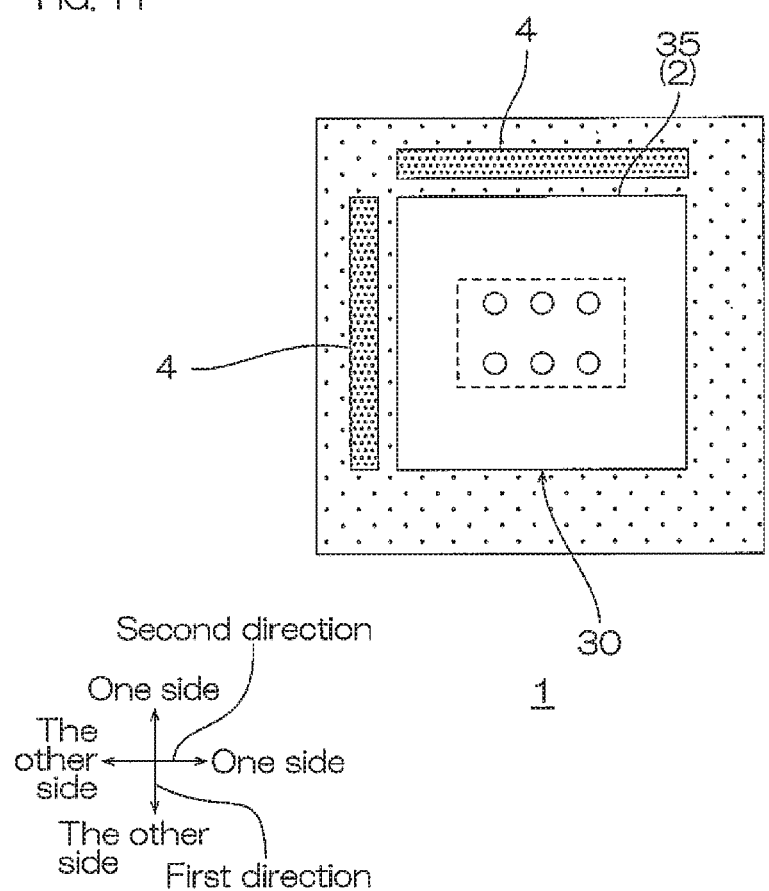
FIG. 11 shows a plan view of a modified example of a singular board area in an imaging element-mounting board of the present invention.

As shown in FIG. 11, the two reinforcement portions 4 are disposed corresponding to the two sides constituting the one apex in the one board area 2.

According to the modified examples of FIGS. 9 to 11, the board area 2 is the singular board area 35 in which the single number of board 30 is disposed in alignment, so that each board 30 can be surely reinforced.

Of the modified examples of FIGS. 10 and 11, preferably, as shown in FIG. 10, the two reinforcement portions 4 are disposed in opposed relation to each other with the board area 2 sandwiched therebetween. When the two reinforcement portions 4 are disposed in opposed relation to each other with the plural board area 3 sandwiched therebetween, the deformation caused by the contractive force can be suppressed, while the generation of the creases and the wrinkles at the time of handling of the plural board area 3 is suppressed.

The modified example of FIG. 9 is more preferably than the modified examples of FIGS. 10 and 11.

In the imaging element-mounting board 1 of the modified example of FIG. 9, the plurality of reinforcement portions 4 are disposed corresponding to each of the sides of the singular board area 35, so that each board 30 can be efficiently reinforced.

Figure 12:
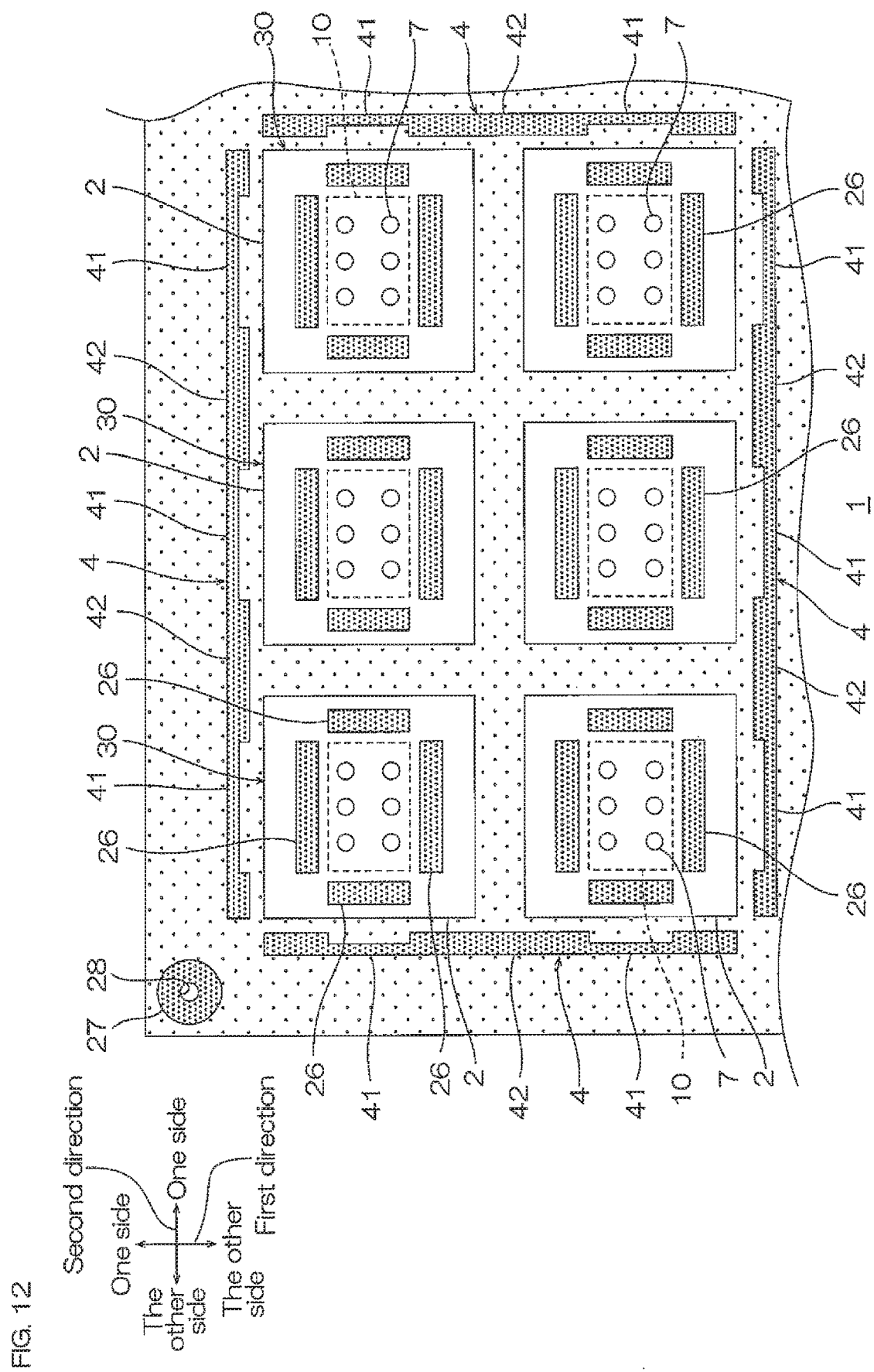
FIG. 12 shows a plan view of a modified example of an imaging element-mounting board of the present invention.

In the one embodiment, each of the plurality of reinforcement portions 4 has the width W that is the same in the direction in which the reinforcement portion 4 extends. However, as shown in FIG. 12, the reinforcement portion 4 can include a narrow-width portion 41 and a wide-width portion 42. In this case, the width W of the plurality of reinforcement portions 4 is defined as an average value of the width of the narrow-width portion 41 and the wide-width portion 42, and the above-described ratio (W/L or the like) is calculated.

The imaging element-mounting board 1 has a second inner-side reinforcement portion 26 that is disposed at the inside of the board area 2. The four second inner-side reinforcement portions 26 are disposed at the outside of the four sides of the mounting area 10 at the inside of the one board area 2. The second inner-side reinforcement portion 26 has the same shape when viewed from the top as that of the reinforcement portion 4, and the material and the layer structure thereof are the same as those of the reinforcement portion 4.

Furthermore, the imaging element-mounting board 1 can also include a third reinforcement layer 27 provided around a through hole 28 provided corresponding to the one plural board area 3.

The through hole 28 has a generally circular shape when viewed from the top passing through the insulating layer 5 in the thickness direction. The through hole 28, for example, functions as an alignment mark (positioning mark used for mounting of the imaging element).

The third reinforcement layer 27 has a generally circular ring shape when viewed from the top. The material and the layer structure of the third reinforcement layer 27 are the same as those of the reinforcement portion 4. The third reinforcement layer 27 reinforces the insulating layer 5 around the through hole 28.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The imaging element-mounting board of the present invention is mounted with an imaging element.

DESCRIPTION OF REFERENCE NUMERALS

1 Imaging element-mounting board
2 Board area
3 Plural board area
4 Reinforcement portion
18 Auxiliary reinforcement portion
30 Board
35 Singular board area
IS Intersection point

The invention claimed is:

1. An imaging element-mounting board comprising:
a board area having a board disposed thereon, the board area being configured to mount an imaging element therein; and
a plurality of reinforcement portions disposed around the board area in opposed relation in a plane direction of the board,
wherein the plurality of reinforcement portions are independent from each other; and
the imaging element-mounting board has no reinforcement portion inside the board area.

2. The imaging element-mounting board according to claim 1,
wherein the plurality of reinforcement portions include the reinforcement portions facing each other in the plane direction of the board, with the board area sandwiched therebetween in the plane direction perpendicular to a thickness direction.

3. The imaging element-mounting board according to claim 1, wherein
the board area is a plural board area in which the plurality of boards are disposed in alignment in a plane direction perpendicular to a thickness direction.

4. The imaging element-mounting board according to claim 3, wherein
the plural board area has a generally rectangular shape, and the plurality of reinforcement portions are disposed corresponding to each of the sides of the plural board area.

5. The imaging element-mounting board according to claim 3 further comprising:
an auxiliary reinforcement portion disposed on the inside of the plural board area.

6. The imaging element-mounting board according to claim 1, wherein
the board area is a singular board area in which the single number of boards is disposed.

7. The imaging element-mounting board according to claim 6, wherein
the singular board area has a generally rectangular shape, and the plurality of reinforcement portions are disposed corresponding to each of the sides of the singular board area in the plane direction.

8. The imaging element-mounting board according to claim 4, wherein
each of the plurality of reinforcement portions has a generally linear shape, the plurality of reinforcement portions is disposed in the plane direction of the board so that a phantom line passing each of the plurality of reinforcement portion has an intersection point, and the reinforcement portion is not formed in a portion corresponding to the intersection point.

9. The imaging element-mounting board according to claim 1, wherein a material for the plurality of reinforcement portions is a metal, and the board area includes a resin film.

10. The imaging element-mounting board according to claim 1, wherein the board area has a thickness of 50 μm or less.

* * * * *